United States Patent [19]
Orava et al.

[11] Patent Number: 6,163,028
[45] Date of Patent: *Dec. 19, 2000

[54] IMAGING SUPPORT FOR REMOVABLY MOUNTING AN IMAGING DEVICE

[75] Inventors: Risto O. Orava, Helsinki; Jouni I. Pyyhtia, Vantaa; Tom G. Schulman, Masala, all of Finland; Miltiadis E. Sarakinos, Geneva, Switzerland; Konstantinos E. Spartiotis, Helsinki, Finland

[73] Assignee: Simage OY, Espoo, Finland

[*] Notice: This patent is subject to a terminal disclaimer.

[21] Appl. No.: 08/974,390

[22] Filed: Nov. 19, 1997

Related U.S. Application Data

[63] Continuation of application No. 08/695,508, Aug. 12, 1996, Pat. No. 5,955,733.

[30] Foreign Application Priority Data

Aug. 29, 1995 [GB] United Kingdom .................. 9517608
Mar. 29, 1996 [GB] United Kingdom .................. 9605978

[51] Int. Cl.[7] .................................................. H01L 27/146
[52] U.S. Cl. ................................ 250/370.08; 250/370.09
[58] Field of Search ........................ 250/370.08, 370.09, 250/208.1

[56] References Cited

U.S. PATENT DOCUMENTS

| | | | |
|---|---|---|---|
| 4,891,522 | 1/1990 | Coon et al. ........................... | 250/370.1 |
| 5,065,245 | 11/1991 | Carnall, Jr. et al. .................. | 250/208.1 |
| 5,391,881 | 2/1995 | Jeuch et al. .......................... | 250/370.09 |
| 5,436,458 | 7/1995 | Tran et al. ............................ | 250/370.09 |
| 5,635,718 | 6/1997 | DePuydt et al. ..................... | 250/370.09 |

FOREIGN PATENT DOCUMENTS 2 030 422   4/1980   United Kingdom .

*Primary Examiner*—Seungsook Ham
*Assistant Examiner*—Richard Hanig
*Attorney, Agent, or Firm*—Kenyon & Kenyon

[57] ABSTRACT

An imaging support for supporting a plurality of imaging device tiles at respective tile mounting locations to define a tiled imaging surface is provided. Each of the imaging device tiles has a semiconductor detector with a plurality of pixel cells coupled to a semiconductor substrate with a corresponding plurality of pixel circuits. The semiconductor detector and the semiconductor substrate are carried on a mount having an imaging device tile contact. The imaging support is configured for mounting each of the imaging device tiles on the imaging support in a non-destructive, removable manner at respective tile mounting locations, each of which includes an imaging support contact at a contact position. Each of the imaging support contacts are configured to cooperate with a respective imaging device tile contact, wherein the imaging device tile contact and the imaging support contact enable a signal of a type selected from a group consisting of a supply, a control signal and a readout signal to be transferred between the imaging device tile and the imaging support.

42 Claims, 7 Drawing Sheets

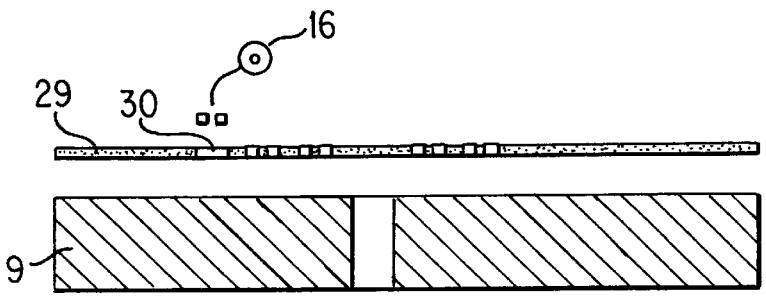
FIG. 5A
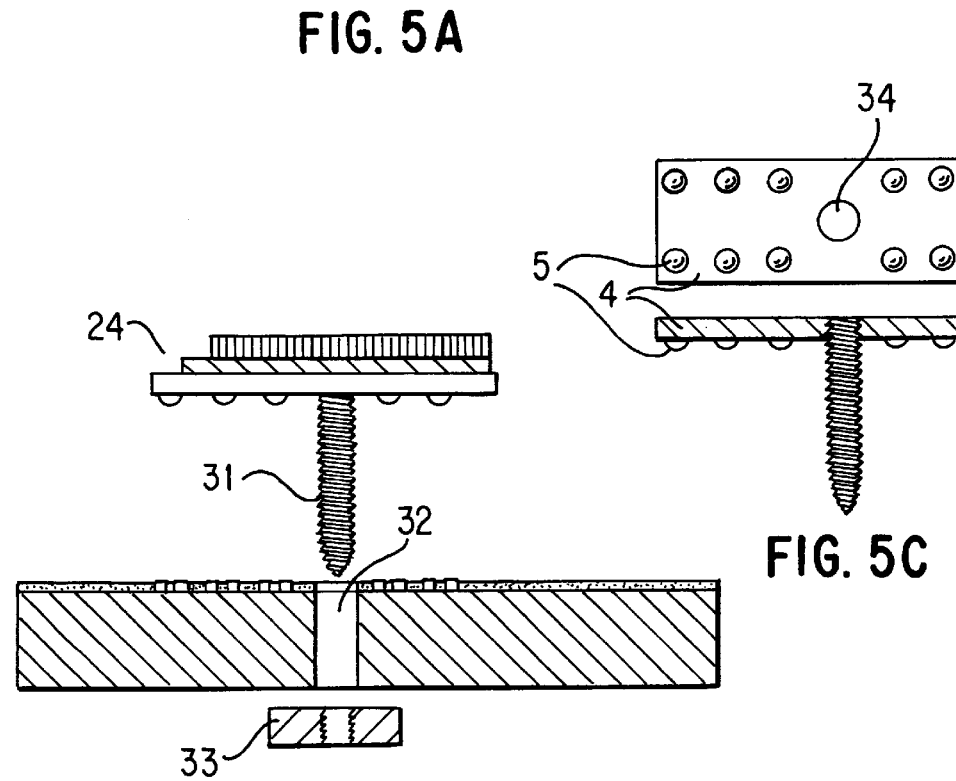
FIG. 5C
FIG. 5B
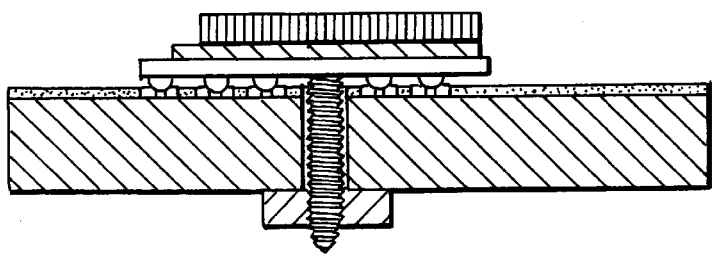
FIG. 5D

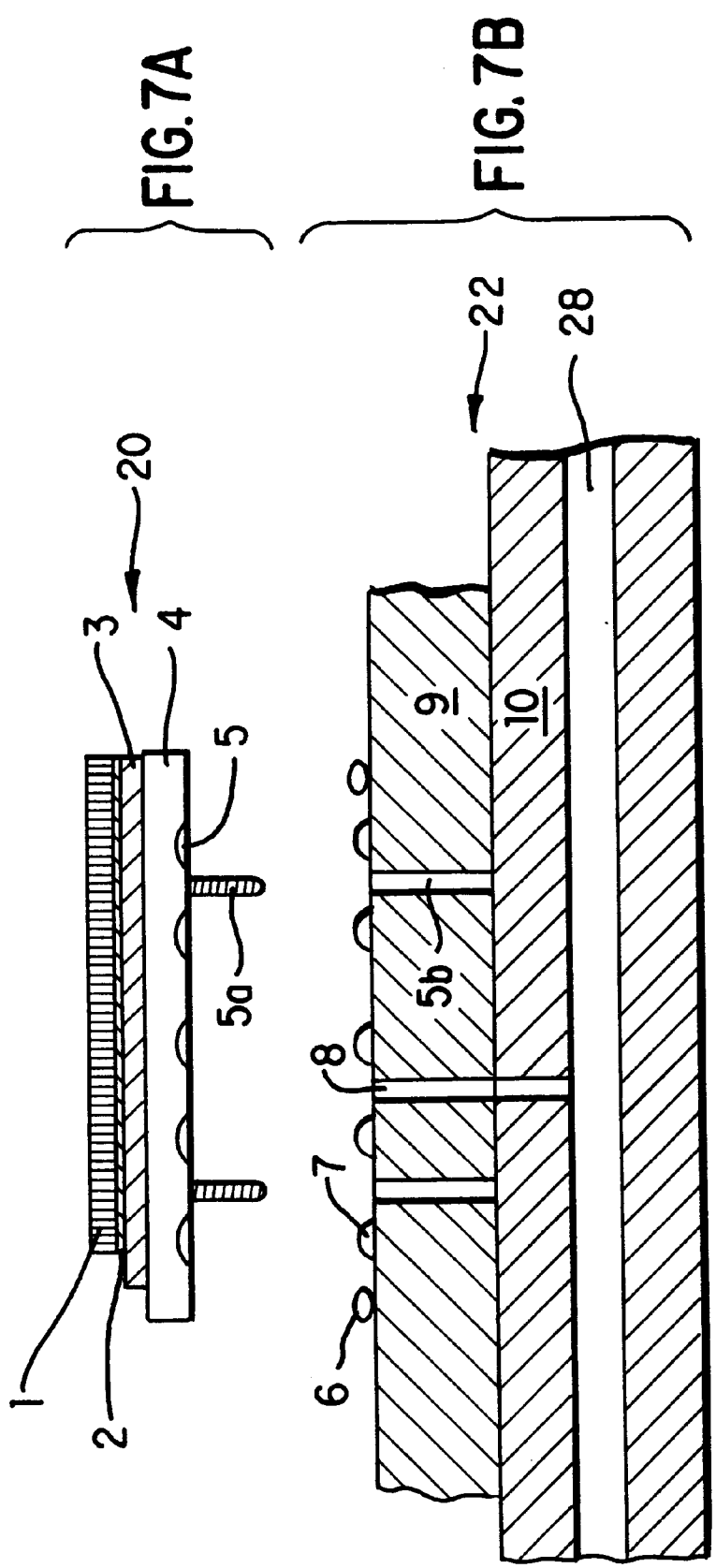

IMAGING SUPPORT FOR REMOVABLY MOUNTING AN IMAGING DEVICE

This is a continuation of application Ser. No. 08/695,508, filed Aug. 12, 1996 (U.S. Pat. No. 5,955,733).

FIELD OF THE INVENTION

The invention relates to an imaging system and method. The invention finds particular application to large area imaging.

Imaging systems are used in a wide range of applications, particularly for imaging for medical diagnosis, in biotechnology and in industrial applications for non-destructive testing and on-line product quality control.

BACKGROUND OF THE INVENTION

For all of the above fields of application, the prevailing means of performing imaging is with the use of radiation, usually X-rays, gamma-rays and beta-rays. Radiation is detected by some sort of imaging plane, which need not be planar. Accordingly, the term imaging surface will be used hereinafter. Images are formed either directly on the imaging surfaces (e.g. projection imaging) or data are processed and images are reconstructed in a computer (e.g. computerized tomography or coded aperture imaging in nuclear medicine).

The traditional imaging surface was formed by a film in a cassette. Other imaging surface solutions have been developed over the past 40 years offering digital imaging. Such examples are NaI scintillating screens, NaI scintillating crystals, BGO crystals, wire gas chambers, digital imaging plates etc. More recently, semiconductor imaging solutions such as Charged Coupled Devices, Si microstrip detectors and semiconductor pixel detectors have been developed.

Typically, in all of the above cases, when a large imaging area is needed it is made either as a monolithic structure (e.g. films, digital imaging plates, NaI screens etc.) or as a mosaic of smaller pieces (tiles) put together and fixed on a support surface (e.g. gamma cameras with NaI crystals).

When a monolithic large imaging surface is employed, if a part of the surface is defective then the whole surface needs to be changed. Unfortunately, the most precise digital on-line imaging devices proposed so far involve pixel-based semiconductors which cannot be manufactured in large areas (larger than a few square cm at most). Moreover, it would not be desirable to manufacture, for example, a monolithic 30 cm by 30 cm digital imaging semiconductor surface because the yield would be low. If a portion of the expensive imaging area became defective, then the whole surface would have to be replaced.

It has been proposed to provide a large area imaging surface (larger than a few square mm) using a tiling approach. In a recent patent application (EP 0 577 487 A1) semiconductor pixel detectors are tiled together to form a larger fixed surface. Using such an approach, individual imaging devices are arranged in a mosaic on an imaging support to form an imaging mosaic. Outputs from the individual imaging devices can be processed to provide a single output image corresponding substantially to the whole area covered by the imaging surface. The imaging devices are fixed to the imaging support in an essentially permanent manner by soldering or the like so that it is difficult or impossible to remove the imaging devices without damage to the devices and/or the support and/or the devices surrounding the device to be removed.

In a construction shown in U.S. Pat. No. 5,391,881, a large imaging device is made by several detectors joined side by side and arranged in the form of a matrix, the detectors being interconnected and associated with several integrated circuit chips arranged in matrix form behind the detectors for reading the signals from the detectors' elements. The integrated circuit chips are displaced relative to the detectors so as to partially overlap two or more detectors. The detectors are connected to the integrated circuit chips in an essentially permanent manner by microspheres, and the overlapping of the chips produces a fixed tiled structure.

It is seen from the above that solutions to large imaging areas proposed so far rely either on monolithic structures or on fixed tiling solutions. As high resolution semiconductor imaging solutions are progressively introduced in radiation imaging there is a need for an efficient way of assembling large imaging areas. Semiconductor imaging solutions are quite expensive both because of the semiconductor cost and also because of the integrated readout electronics. Therefore it is important to maximize the effective use of each square unit of imaging area.

Reference may be made to GB-A-2030422 which describes an x-ray tomography system with replaceable detector modules which are slidably received in radial compartments in an arcuate frame. However, each detector is quite narrow and is spaced from adjacent detectors, making this system unsuitable for large area "tiled" image detectors.

In a different field, U.S. Pat. No. 4,891,522 describes a 3-dimensional multi-layer high energy particle detector for a calorimeter. Each layer consists of a number of detector modules removably secured to a carrier member by conductive adhesive tape. An essential part of that design is that each detector module includes a feed-through connection pin for electrical connection to a corresponding detector module in an adjacent layer. Such a 3-dimensional calorimetric detector does not relate to the field of imaging, and does not address the problems in providing a tiled image detector surface or plane. Further, the resolution is limited to the size of each detector module, which means that the design is not suitable for high resolution pixel imaging.

SUMMARY OF THE INVENTION

An object of the invention is to provide an imaging system and method which, while providing the advantages of the tiling approach, remove or at least mitigate the problems of the prior art.

In accordance with a first aspect of the invention, there is provided an imaging support for supporting a plurality of imaging devices in respective positions to define an imaging surface, the imaging support comprising means for removably mounting the imaging devices on the imaging support in a non-destructive, removable manner.

In accordance with another aspect of the invention, there is provided a method of forming an imaging array comprising:
 providing an imaging support for supporting a plurality of imaging devices in respective positions to define an imaging surface; and
 removably mounting the imaging devices on the support in a non-destructive, removable manner.

The invention also relates to an imaging device for use in the aforesaid apparatus and/or method, and to a system based on the aforesaid apparatus.

The invention is particularly suitable for imaging devices of the type having a plurality of imaging regions from which respectively identifiable output signals may be produced.

Unlike prior art large area imaging systems, the imaging devices are removable without damage to the device to be removed, the surrounding devices or the support. In this manner, defective devices can readily and quickly be replaced. Moreover, correctly functioning imaging devices can easily be removed and re-used on the same or a different imaging support. Thus, with a set of imaging devices and a number of different supports, different imaging surfaces can be constructed without needing to have enough imaging devices for each of the imaging supports. As a result, modular imaging surfaces can easily and cost effectively be assembled and maintained.

In its broadest sense, the invention is not limited by the number of imaging devices to be mounted on the support. For example, in applications such as intra-oral dental imaging, or the non-destructive testing of small objects, as few as two imaging devices might be used, and an imaging support may be configured to mount two imaging devices. In other applications, such as full field thorax imaging, hundreds of imaging devices might be mounted on one (or more) supports, and even more imaging devices might be used in large image detectors for other applications.

A preferred feature is that the imaging support comprises contacts for a transfer of at least a supply, a control signal and a readout signal (output signal) between the imaging support and an imaging device mounted on the imaging support. Such an arrangement allows the use of "active" semiconductor imaging devices, which include on-board electronic circuits.

In a preferred embodiment, the imaging devices comprise a semiconductor pixel, or other array, detector and its associated readout chip.

Additionally (or alternatively), a further preferred feature is that each imaging device be mounted on the imaging support by mounting means which results in the imaging device being subjected to a force urging the imaging device towards the imaging support. Preferably, the force is maintained on the imaging device in use (until it is desired to release the imaging device). Such an arrangement can provide positive positioning of the imaging device on the imaging support, and can provide good contact pressure at the electrical connections between the imaging device and the imaging support. This can ensure excellent electrical connections to the imaging device, even in very compact and/or high mounting density applications.

In one embodiment, the imaging devices are temporarily kept in place on the master plane by means of a reduced air pressure (vacuum). In an alternative preferred embodiment, said imaging devices are removably secured using nuts and bolts, or screws. In these and other possible embodiments, an adjustable degree of force can be applied to attach the imaging devices to the imaging supports in order to ensure good alignment and good electrical contact.

In a closely related aspect, the invention provides an imaging device comprising securing means which can be used in the securing, in a non-destructive, removable manner, of the imaging device to an imaging support.

The securing means may be threaded, and comprise, for example, a threaded hole or pin, but these are merely examples.

The imaging device may comprise a plurality of image detection regions, from each of which a respectively identifiable output can be produced.

The imaging device may comprise a plurality of contacts for a transfer of a supply, a control signal, and a readout signal (output signal) between the imaging device and a said imaging support on which the imaging device is mounted.

The imaging device may comprise a readout integrated circuit for reading the signal from the or each detection region.

BRIEF DESCRIPTION OF THE DRAWINGS

Embodiments of the invention are described hereinafter, by way of example only, with reference to the accompanying drawings in which:

FIG. 5(A–D) is a schematic representation of a further embodiment of an imaging support with an imaging device located thereon.

FIGS. 7A and 7B are schematic cross-sectional views of an imaging device.

DESCRIPTION OF PREFERRED EMBODIMENTS

Embodiments of the invention provide a new imaging mosaic system and a method for producing imaging mosaics using a plurality of imaging devices (tiles) and an imaging support. The imaging devices are positioned and held on the support in a reversible and non-destructive way. The removable positioning/fixing means allow individual imaging devices to be removed multiple times so that the same imaging device can be used in a different imaging support or it can be replaced if found to be defective without damaging the imaging support and without affecting the operation of any other imaging device on the imaging support.

As individual imaging devices can be removed and re-positioned any number of times the same imaging devices can be used in a number of applications. For example imaging devices used for mammography can be quickly transferred on a different imaging support for chest X-rays. A variety of imaging supports can have different sizes and shapes but only one set of imaging devices is needed. Additionally replacing an imaging device can be done by a nonexpert and maintenance costs are minimized. Accordingly, contrary to the prior art where large imaging areas have monolithic imaging means or a fixed tiled imaging plane, the invention introduces a new large area imaging system where the imaging mosaic is made of removable imaging devices allowing for multi-purpose use and re-use of the individual imaging devices, while also allowing cost effective maintenance of the imaging areas.

In a preferred embodiment, by way of example only, the imaging devices comprise Active Semiconductor Imaging Devices (ASIDs) as described in the present applicant's patent application PCT/EP95/02056. An ASID is an active, dynamic semiconductor pixel imaging device with dimensions from possibly few square mm to several square cm.

Figure 1A:
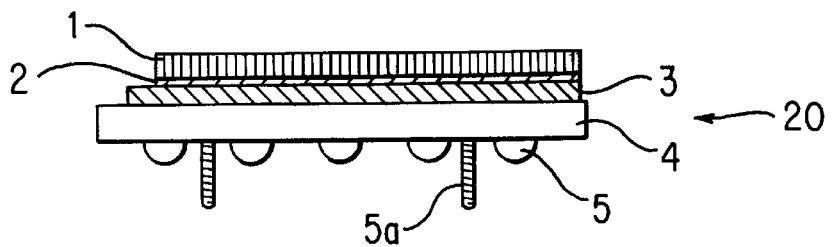
FIG. 1A is a schematic cross-sectional view of an imaging device.

A cross-section of one such imaging device (tile) 20 is shown schematically in FIG. 1A. The surface area of the imaging device can vary depending on the application and the semiconductor materials chosen. Typical sizes are of the order of one square millimeter to several square centimeters, although the invention is not limited to imaging devices of these sizes. Radiation enters the semiconductor detector 1 from one face (the top face in FIG. 1A) and upon absorption creates an electric charge. On the exit face of the detector electrode pads define the detector cells or pixels. Charge created from successive radiation thus is accumulated on the corresponding pixel circuits 3 which are connected to the detector pixels via conductive microbumps 2 (e.g. indium bumps). The pixel circuits 3 are formed on a semiconductor substrate which is mounted on a mount 4, for example a circuit board (PCB), of said imaging device. Each such imaging device 20 has tens of thousands of pixels but only needs around 5–10 external lines that will provide control signals, supply voltage and will readout the signal. These lines are provided on the PCB 4 and also on the imaging support 22 on which the imaging device 20 is mounted.

Figure 1B:
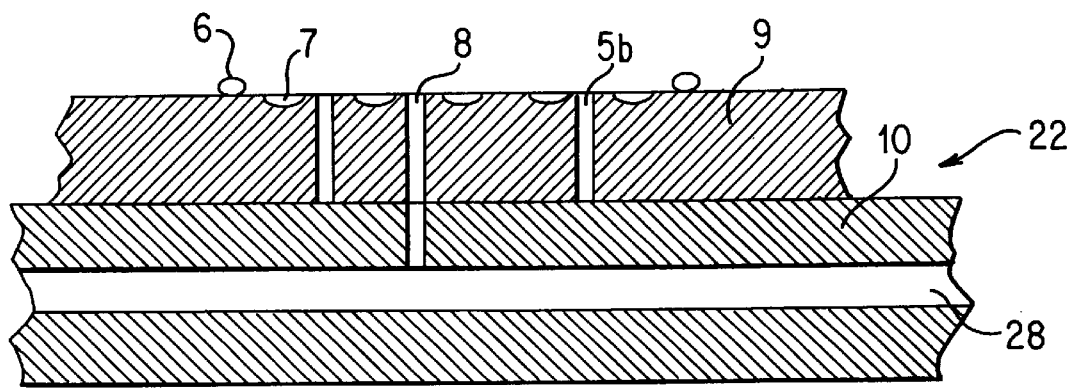
FIG. 1B is a schematic cross-sectional view of part of an imaging support.

The imaging device 20 itself carries an equal number of contacts 5 in the form of, for example, small metal spheres or bumps. As shown in FIG. 1A and 1B these metal spheres match an equal number of small appropriately sized metal spherical holes or cavities 7 on a circuit board 9 of the imaging support 22. The cavities on the imaging support 22 are connected to the aforementioned control, supply and signal lines (not shown).

The imaging devices 20 are mounted on the imaging support 22 in a non-destructive manner so that the imaging device 20 can easily be re-positioned on a different imaging support 22 if needed or the imaging device 20 can be changed. In this embodiment, non-destructive mounting is provided by an additional small aperture 8 on the imaging support 22 through which air from beneath the imaging device 20 can be extracted, so that the imaging device 20 is held onto the imaging support by the pressure differential between atmospheric pressure on the upper surface of the imaging device 20 and the reduced air pressure below the imaging device 20. At each mounting location on the imaging support, a gasket 6 formed from a flexible impervious sealing material in a ring shape (e.g. an 'O'-ring) is provided to ensure that the air pressure differential between the upper and lower surfaces of the imaging device 20 are maintained.

Figure 1C:
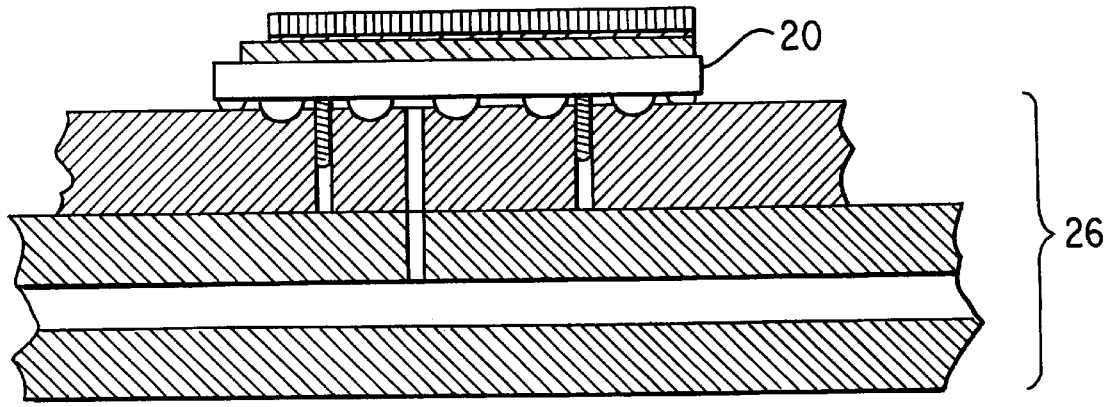
FIG. 1C is a schematic cross-sectional view of the imaging device located on the imaging support.

Additionally, alignment pins 5a and alignment holes 5b are provided on the imaging device 20 and the imaging support 22, respectively, to assist in locating the imaging device 20 on the imaging support 22 (better than 10 µm positional accuracy is achievable) before suction. Pins 5a will ensure that the contacts 5 on the imaging device 20 will properly match the female connectors 7 on the imaging support 22 after suction. Moreover, because of the close tolerances between the pins 5a and holes 5b, these pins and holes will help to prevent the imaging devices 20 from falling out of the mounting locations (sockets) for the imaging devices 20 when the arrangement shown in FIG. 1 is at an angle to the horizontal or even inverted.

Figure 2:
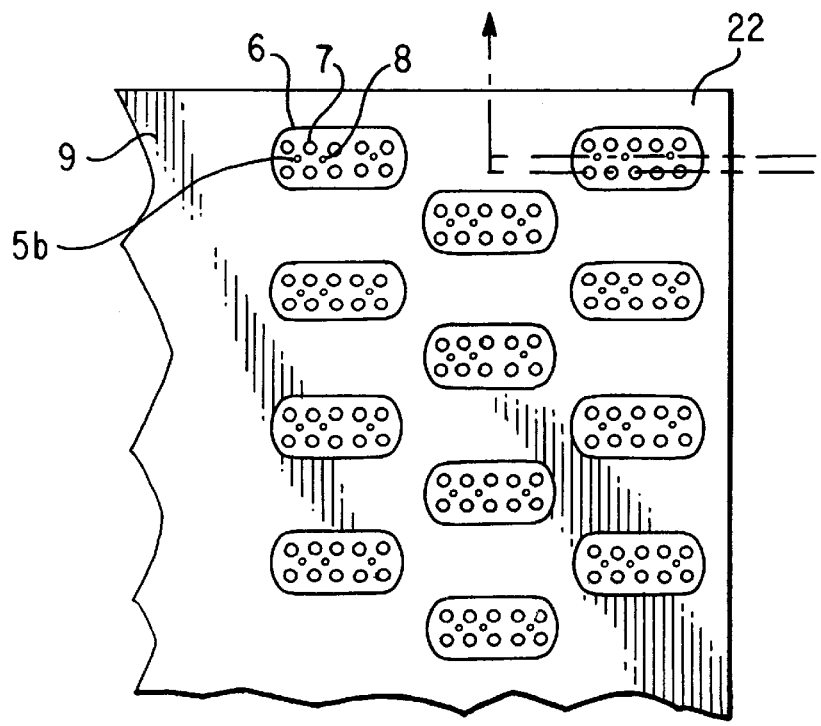
FIG. 2 is a schematic plan view of the imaging support.

FIG. 2 shows a plan view of the imaging support 22, which provides a support surface, or plane (e.g., a PCB 9) with a plurality of mounting locations (sockets) for the imaging devices 20. It should be noted that the imaging devices 20 have been arranged in a linear array of columns, with adjacent columns being displaced in the column direction. This way the small inactive space between imaging devices 20 will be covered when the imaging support 22 moves in a direction perpendicular to the column axis as described in patent application PCT/EP95/02056. In practice the mounting locations will be closer than illustrated, schematically, in FIG. 2.

Figure 3:
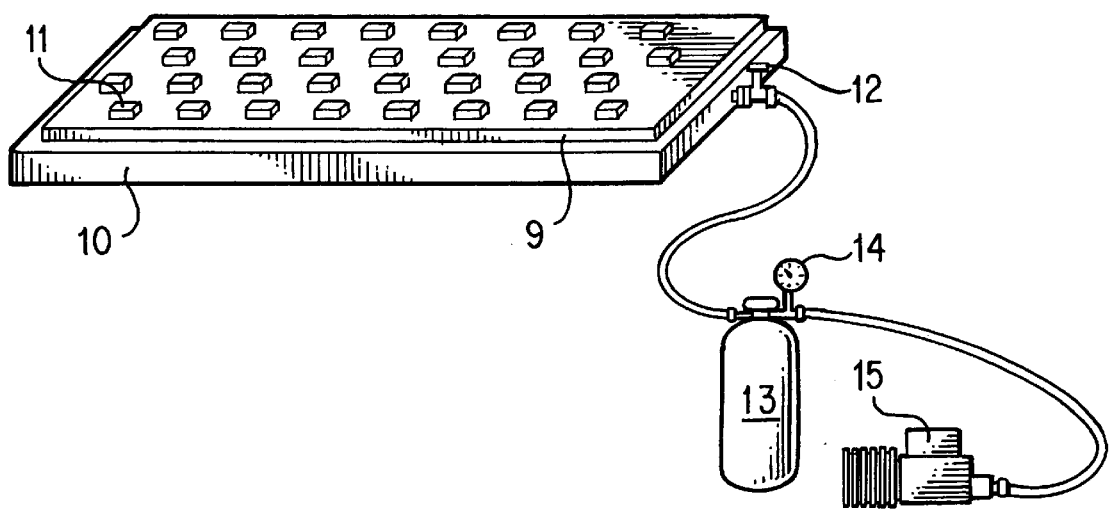
FIG. 3 is a schematic view of an imaging system.
Figure 4A:
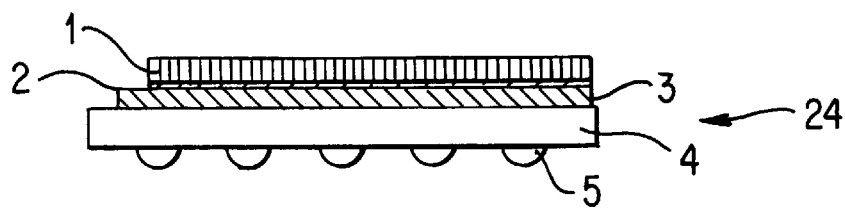
FIG. 4(A–D) is a schematic view of an alternative imaging support with the imaging device located thereon.
Figure 4B:
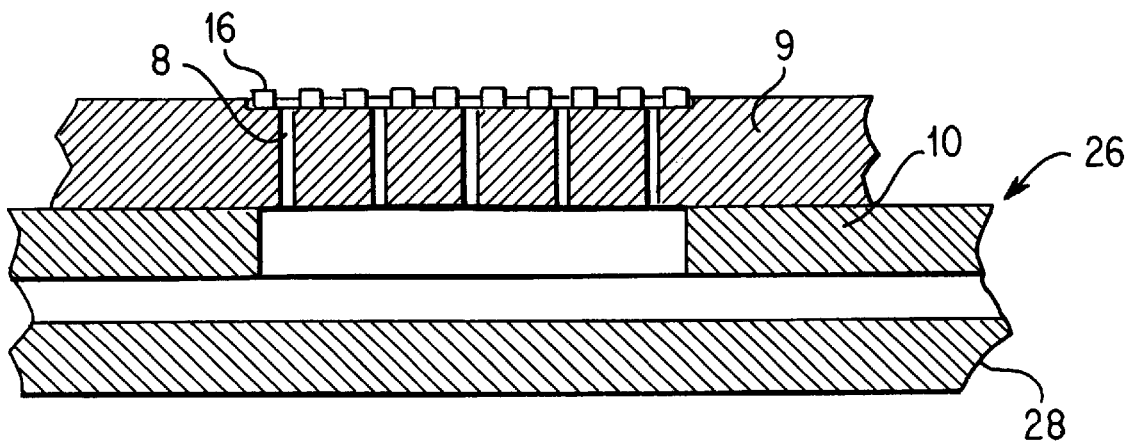
Figure 4C:
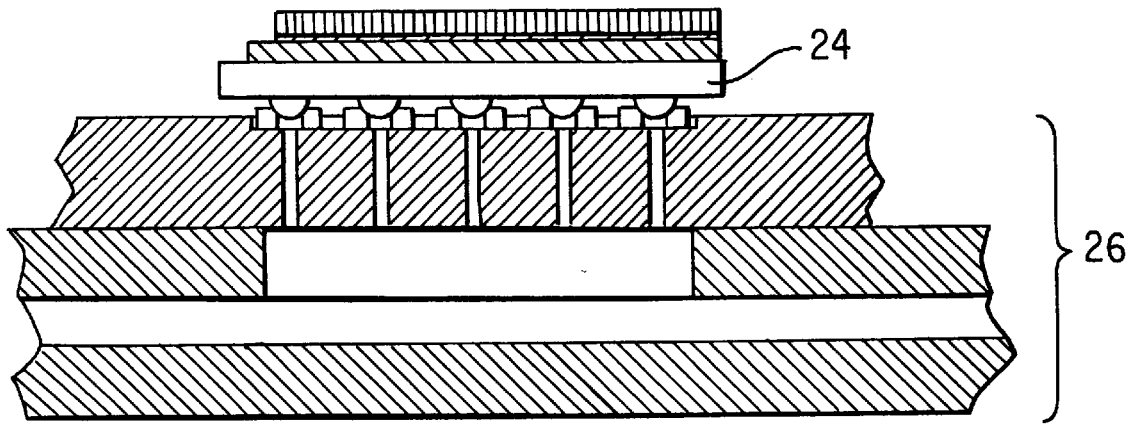
Figure 4D:
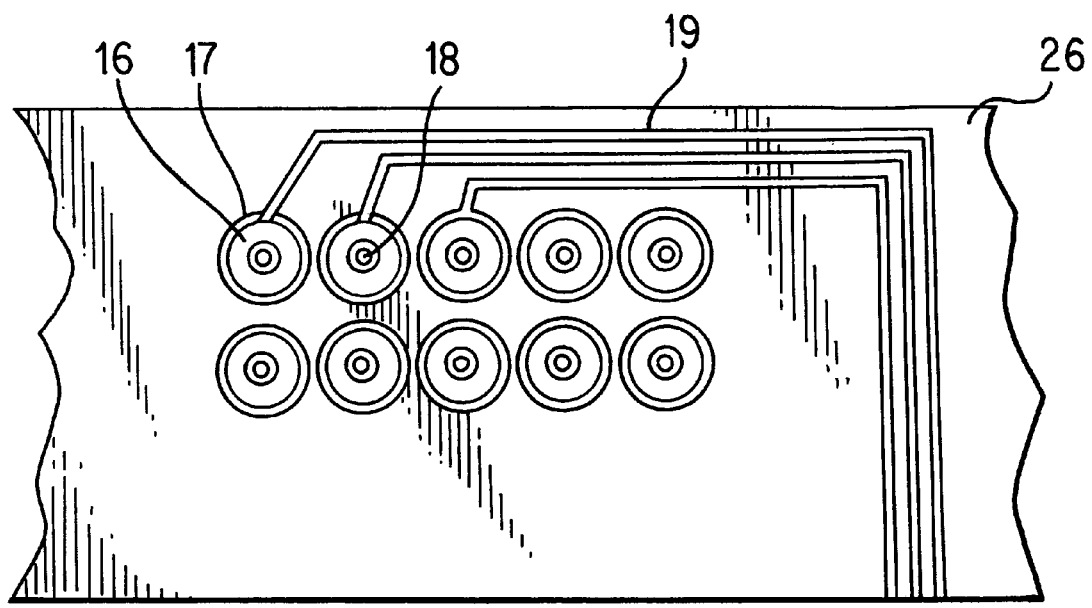
Figure 6A:
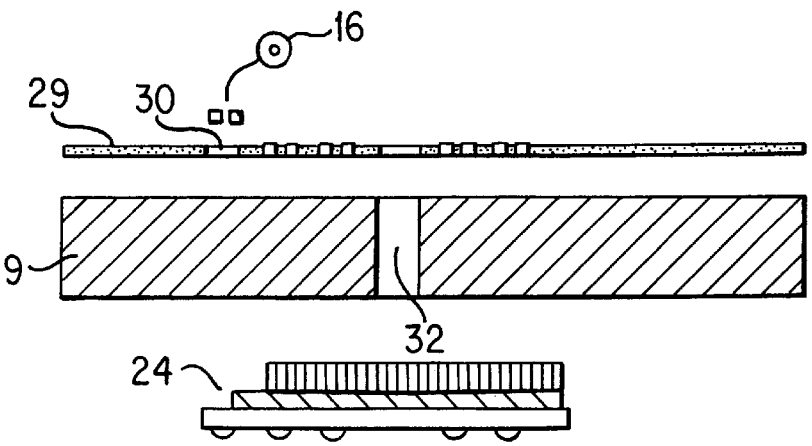
FIG. 6(A–D) is a schematic representation of a further embodiment of an imaging support with an imaging device located thereon.
Figure 6C:
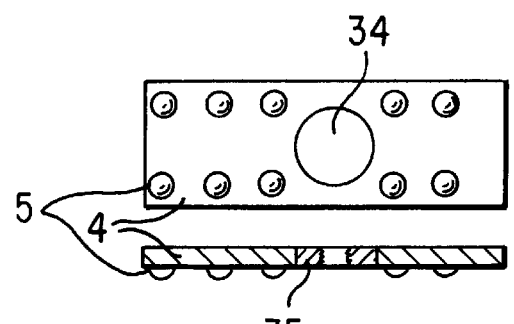
Figure 6B:
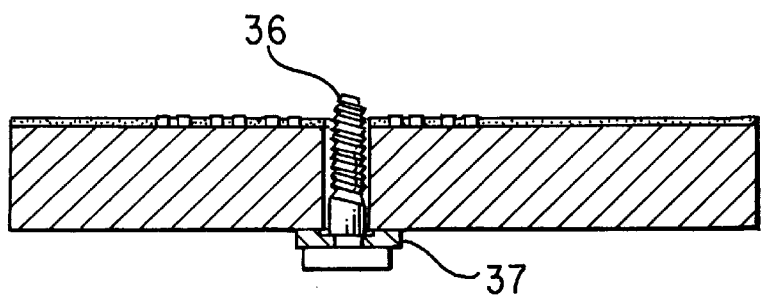
Figure 6D:
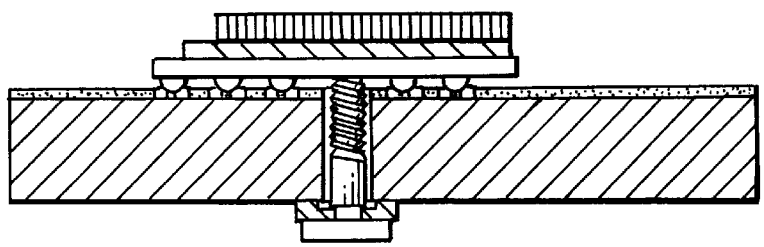

In accordance with this example of the invention, all the imaging devices 20 are provided with an aperture for suction and only one common vacuum pipe is needed per imaging support 22 as shown in FIG. 3. In the same Figure, a valve 12 controls the vacuum condition which is monitored from a gauge 14. A vacuum container 13 acts as a vacuum buffer to further enhance the vacuum condition when needed. The vacuum pump 15 can be located remotely so that it does not cause any disturbance by its presence or as a result of noise.

If a particular example, e.g., mammography, is considered, an imaging surface of 30 cm by 30 cm (about 600 imaging devices of the type described in patent application PCT/EP95/02056) will be needed. The 600 imaging devices will be mounted on a printed circuit board 9 of the imaging support 22. In accordance with this example of the invention, one aperture 8 is provided for each imaging device 20. All the apertures are connected to a common vacuum pipe for simultaneously sucking all the imaging devices 20 into position. The vacuum condition is easily monitored with a gauge 14 or pressure threshold sensor and additional air can be sucked out via the buffer container 13. Once imaging devices 20 have been sucked in, the vacuum pipe may be removed from vacuum switch 12 since the gaskets 6 are air-tight.

When an imaging device 20 needs to be removed, all that is needed is to open the vacuum switch 12 and one or more or indeed all of the imaging devices 20 are ready to be removed and relocated or substituted. As mentioned above, the engagement of the pins 5a in the holes 5b will assist in retaining imaging devices 20 until physically removed by the operator.

In this example, all the apertures 8 are connected via passages 28 in a support structure 10 of the imaging support 22 to a common valve 12. However, a plurality of valves could be provided so that the vacuum can be supplied individually to apertures 8 or groups of apertures 8 for respective mounting locations. Selectively removing or applying suction could be used to assist in the individual mounting or removal of imaging devices 20. Also, rather than a manual valve, electronically controlled valves could be provided under the control, for example, of a control computer or other control mechanism.

FIG. 4 illustrates an alternative to the imaging support of FIG. 1. FIG. 4A is a schematic cross-sectional view of an imaging device 24 similar to that of FIG. 1A. FIG. 4B is a schematic cross-sectional view of part of the alternative imaging support 26. FIG. 4C is a schematic cross-sectional view of the imaging device 24 located on the alternative imaging support 26. FIG. 4D is a schematic plan view of the alternative imaging support 26.

As illustrated in FIG. 4, an air-tight gasket 16 is provided at the surface of each of the contacts 17 of the imaging support 26. The gaskets 16 are made of a flexible impervious sealing material which is electrically conductive. Any suitable material can be used which is either conductive in itself, or made conductive, for example by impregnating it with conductive material in a suitable manner as will be apparent to one skilled in the art.

An aperture 18 is provided for each contact 17. Each gasket 16 surrounds the respective aperture 18 and is also connected to the corresponding lines or wires 19 on the imaging support 26. In this example, as in the example described above, the apertures 18 can be connected to a common vacuum pipe via a common valve, or via separate valves, etc, as required.

Accordingly, the FIG. 4 embodiment differs from the FIG. 1 embodiment in that a separate gasket is provided for each contact, rather than each imaging device. The use of the individual conducting gaskets 16 which are directly connected to the imaging support lines ensures good contact of each and every bump connector on the imaging device to the corresponding female connector 17 on the imaging support 26.

Although no alignment pins and holes corresponding to the pins/holes 5a, 5b of the first embodiment are shown in the FIG. 4 embodiment, these can additionally be provided in the FIG. 4 embodiment to aid accurate location and/or retention of the imaging devices 24.

Also the removable mounting may be achieved without the use of vacuum, for example by clips, socket arrangements, magnets etc.

FIG. 5 shows another embodiment of the invention. In this embodiment suction is not required for mounting the imaging device tiles to the master plane. FIG. 5A is a cross-sectional view of the master plane support 9 with an insulating layer 29 and conductive rubber rings in holes in the insulating layer. FIG. 5B is a cross-sectional view illustrating an imaging device over an imaging device location. FIG. 5C provides a view of the underside and a cross-sectional view of an imaging device mount (e.g., a PCB) 4. FIG. 5D is a cross sectional view of an imaging device secured at an imaging device location by engagement of a nut over a screw of the imaging device.

Each contact between the imaging device mount 4 and the master plane 9 is ensured by a separate conductive rubber ring 16. These are placed in appropriate holes of an electrically insulating support plane 29, which is aligned and glued on top of the master plane 9. The holes in the conductive rubber rings are not necessary in this case as no air suction is used. However, they are still useful for aiding alignment of the tile. Alternatives to the conductive rubber rings 16, such as conductive polymers or metal springs, may be used. A screw 31 is glued into a hole 34 in the imaging device mount 4. This screw is pushed through the hole 32 in the master plane and secured by the nut 33. The nut is tightened to press the metal balls 5 of the imaging device mount 4 against the rubber rings 16 which in turn are pressed against the metal pads of the master plane ensuring good electrical contact.

This embodiment is particularly suitable for providing an imaging area comprising a plurality of easily removable semiconductor pixel imaging devices as described in PCT/EP95/02056, or other types of pixel semiconductor imaging devices. This embodiment can also be used in all of the applications described above.

This embodiment has the advantage that it is not necessary to provide a vacuum for the mounting of the imaging devices, with a resulting reduction in cost and ease of use. By means of the screws and nuts it is also possible individually to adjust the mounting force for each imaging device to ensure good alignment and good electrical contact using flexible contact elements such as the conductive rubber rings. It will be appreciated that the number of imaging devices may vary widely depending on the application. For example, for intra-oral dental imaging, or for non-destructive testing of small objects, as few as two image devices might be used, and the imaging support for such applications may be configured accordingly. For larger imaging applications, such as full field imaging of the thorax, hundreds of imaging devices may be needed (these could either be mounted in a single imaging support, or in groups on more than one imaging support).

Alternatives to the specific example of the nuts and screws are possible while still retaining the advantages of this embodiment.

For example, wing nuts can be used to aid tightening and subsequent release of nuts. Also, the nuts could be provided with an elongate form on the screws, and the holes in the master plane could be in the form of slits, so that the elongate nuts could be inserted through the slots and then tightened so that the elongate nut engages with the rear surface of the master plane. By suitably configuring the dimensions of the nut and the slot, an acceptable range of rotary adjustment could be provided.

As a further alternative, a rotatably mounted pin could be provided on the rear of the mount for the imaging device, which pin is provided with at least two perpendicular projections to be passed through an equivalently shaped key hole in the master plane, the pin then being turned after insertion through the keyhole so that the projections engage behind master plane to secure the imaging device.

Another embodiment is illustrated in FIG. 6. The four schematic views 6A, 6B, 6C and 6D correspond generally to those of FIG. 5, except that in this case the mount 5 of the imaging device is provided with a threaded hole 35 into which a screw 36, which is rotatably mounted at an imaging device location on the master plane 9, could be engaged to secure the imaging device to the master plane. The screw 36 could be inserted through a hole 32 in the master plane 9 at the imaging device location when it is desired to attach an imaging device at that location.

Alternatively, and as shown in FIG. 6, it could be permanently mounted, in a rotatable manner, at the imaging device location. For example a neck on the screw could be mounted in a collar 37, which collar is then attached over the hole 32 in the master plane at an imaging device location so that the screw 36 is rotatably mounted at that location. In this embodiment, the imaging device support will have an array of upstanding screws 36 to which the imaging devices with threaded holes can be attached. This embodiment provides advantages as regards ease of use.

As an alternative to a screw 36 and threaded hole 35 in this embodiment, other similar arrangements, for example a stud with bayonet pins rotatably mounted in the master plane 9 and cooperating hole with bayonet pin receiving structures on the mount 5 could be provided.

Using an embodiment of the invention, for example one of the embodiments described above, it is thus possible to configure a variety of clinical equipment with the imaging supports ready and mounted on the corresponding systems utilized for the imaging devices. Imaging devices can be properly packaged and supplied separately from the rest of the imaging system and any average technical employee can handle them and relocate them from one plane to another. In this way, the use of the relatively expensive pixel semiconductor imaging devices is optimized by requiring less imaging devices than are needed simultaneously to equip all systems. In addition, maintenance becomes cost effective. A defective imaging device can be substituted rather than the whole imaging surface (mosaic) and this can be done easily by an average technical employee.

The invention can be used for any radiation type in any radiation imaging field where areas larger than a few square mm are needed. In particular it finds application in medical diagnosis imaging (for example, computer tomography) with X-rays and gamma-rays, in biotechnology imaging with beta-rays (where isotopes are used as labels on the samples to be imaged) and in industrial applications for non-destructive testing and product quality control.

There has, therefore been described a mosaic imaging system and a method for assembling a mosaic imaging plane made of individual imaging devices (tiles).

The method comprises the following steps:
1) manufacturing individual imaging devices (tiles) and packaging them so as to have access through a number of contacts to all needed control, supply and readout signals on the imaging device;
2) manufacturing an imaging support (master plane) having contacts for each contact on the imaging device, the imaging support contacts being connected to appropriate control, supply and readout signal lines for connection to external circuitry, the imaging support contacts preferably also serving to aid alignment of the imaging device by co-operation with the imaging device contacts;
3) positioning each one of the imaging devices on the master plane with the corresponding contacts being aligned;
4) removably securing the position of each of the individual imaging devices to the imaging support in a non-destructive manner such that the imaging devices may subsequently be removed individually without damage.

The removable securing is achieved in a non-destructive way such that an imaging device may be secured to and removed from an imaging support a plurality of times leaving the imaging device, the board(s) and corresponding contacts in substantially the same state.

The removable mounting may be achieved using alternative techniques including:
  reduced air pressure, or vacuum as described above, whereby the imaging devices are sucked into position;
  screws glued to the PCBs or other mounting means of the imaging devices and then pushed through corresponding holes in the master plane, the screws being then secured by nuts on the opposite side of the master plane;
  a socket configuration (preferably zero-insertion force socket means) whereby the imaging devices have pins that plug into corresponding sockets on the imaging support;
  clips, whereby the imaging devices are kept in position with mechanical clips, strings or the like;
  magnets, whereby small magnets, either on the imaging support or on the imaging devices, or both, secure the imaging devices to the imaging plane;
  other mechanical arrangements.

While specific embodiments have been described, it is to be understood that many modifications and alternatives can be made without departing from the invention.

For example imaging mosaic planes may comprise other semi-conductor devices such as CCD's, photodiodes, amorphous Silicon and Selenium with thin film transitors, and other non-semiconductor pixel devices, such as removable NaI scintillating crystals (such as NaI crystals) or small scale wire gas chambers.

Also, rather than providing contact spheres or bumps on the imaging devices, and matching holes or cavities on the imaging support, at least some or all of the bumps could be provided on the imaging support with cooperating formations on the imaging devices (see FIGS. 7A and 7B). Indeed, rather than bumps and holes, other contact configurations (e.g., pins or plates) could be used in other embodiments.

Also, the features of individual embodiments could be combined, for example through the use of suction and screws.

What is claimed is:

1. An imaging support for supporting a plurality of imaging device tiles at respective tile mounting locations to define a tiled imaging surface, each of said imaging device tiles comprising a semiconductor detector with a plurality of pixel cells coupled to a semiconductor substrate with a corresponding plurality of pixel circuits, said semiconductor detector and said semiconductor substrate being carried on a mount having an imaging device tile contact, said imaging support being configured for mounting each of said imaging device tiles on said imaging support in a non-destructive, removable manner at respective tile mounting locations, each tile mounting location including an imaging support contact at a contact position, each of said imaging support contacts being configured to cooperate with a respective imaging device tile contact, said imaging device tile contact and said imaging support contact enabling a signal of a type selected from a group consisting of a supply, a control signal and a readout signal to be transferred between said imaging device tile and said imaging support.

2. The imaging support of claim 1, wherein each tile mounting location further comprises a plurality of imaging support contacts configured to cooperate with a plurality of respective imaging device tile contacts.

3. The imaging support of claim 1, wherein the imaging device tile contacts and the imaging support contacts include contacts enabling a transfer of a control signal and a readout signal for reading out from said imaging device tile a signal from each of a plurality of image detecting regions of the imaging device tile.

4. The imaging support of claim 1, wherein one of said imaging support contacts comprises a recess for receiving a correspondingly shaped bump on one of said imaging device tiles, or a bump for receiving a correspondingly shaped recess on one of said imaging device tiles.

5. The imaging support of claim 1, wherein the imaging support is configured for the removable mounting of imaging device tiles by maintaining directly or indirectly a force on the imaging device tile to urge the imaging device tile towards the imaging support.

6. The imaging support of claim 1, wherein one of said tile mounting locations is configured to provide an adjustable mounting force removably mounting said imaging device tile at said tile mounting location.

7. The imaging support of claim 6, comprising an air passage at one of said tile mounting locations, said air passage being connected or connectable to a pressure reduction means.

8. The imaging support of claim 6, further comprising an air passage at each contact position in one of said tile mounting locations on said imaging support, said air passage being connected or connectable to said pressure reduction means.

9. The imaging support of claim 7, wherein each air passage for a plurality of tile mounting locations is connected to a common pressure reduction means.

10. The imaging support of claim 8, wherein each contact position is surrounded by a seal to maintain reduced pressure under a respective imaging device tile contact.

11. The imaging support of claim 10, wherein said seal is conductive to electrically connect said respective imaging device tile contact to a conductor on said imaging support.

12. The imaging support of claim 6, further comprising a threadedly engageable means for mounting said imaging device tile.

13. The imaging support of claim 6, further comprising a hole on said imaging support for each of said tile mounting locations, said hole being of appropriate diameter to accommodate a securing protrusion extending from an imaging device tile.

14. The imaging support of claim 13, further comprising a fastening means for engaging with said securing protrusion.

15. The imaging support of claim 14, wherein said fastening means comprises a nut and said securing protrusion comprises a screw, said nut being adapted to be tightened on said screw after said imaging device tile has been positioned at a tile mounting location with said screw extending through said hole, whereby said nut is used to secure said imaging device at said tile mounting location with an adjustable mounting force.

16. The imaging support of claim 12, wherein said threadedly engageable means comprises a screw located or locatable at each tile mounting location for engaging with a threaded hole in a mount of an imaging device tile.

17. The imaging support of claim 1, wherein said imaging support contact includes a conductive member electrically connecting and ensuring electrical connection of a respective imaging device tile contact to a conductor on said imaging support.

18. The imaging support of claim 17, further comprising an insulating substrate, said conductive member being arranged on said insulating substrate, said insulating substrate being aligned to provide electrical contact between said imaging support contact and a respective imaging device tile contact via said conductive member.

19. The imaging support of claim 17, wherein each conductive member has a hole for aligning a bump of said imaging device tile contact or of said imaging support contact with a corresponding recess of said imaging support contact or said imaging device tile contact, respectively.

20. The imaging support of claim 19, wherein said conductive member comprises one of a conductive rubber member, a conductive polymer member, or a metal spring.

21. The imaging support of claim 1, further comprising at least one resiliently compressible spacer arranged between said imaging device tile and said imaging support.

22. The imaging support of claim 1, wherein each of said imaging device tile further comprise a plurality of imaging device tile contacts configured to cooperate with a respective plurality of imaging support contacts.

23. An imaging system comprising a plurality of imaging device tiles and an imaging support for supporting the imaging device tiles at respective tile mounting locations to define a tiled imaging surface, each of said imaging device tiles comprising a semiconductor detector with a plurality of pixel cells coupled to a semiconductor substrate with a corresponding plurality of pixel circuits, said semiconductor detector and said semiconductor substrate being carried on a mount having an imaging device tile contact, said imaging support being configure for mounting each of said imaging device tiles on the imaging support in a non-destructive, removable manner at respective tile mounting locations, each tile mounting location including an imaging support contact at a contact position, each of said imaging support contacts being configured to cooperate with a respective imaging device tile contact, the imaging device tile contact and the imaging support contact enabling a signal of a type selected from a group consisting of a supply, a control signal and a readout signal to be transferred between the imaging device tile and the imaging support.

24. The imaging system of claim 23, further comprising a plurality of different imaging supports and a common set of imaging device tiles, each of said imaging device tiles being removably mountable on a selected imaging support at any one time, and further capable of being moved to, and removably mounted on, another of said imaging supports.

25. The imaging support of claim 23, wherein each tile mounting location further comprises a plurality of imaging support contacts configured to cooperate with a plurality of respective imaging device tile contacts.

26. An imaging device tile for mounting with one or more other imaging device tiles on an imaging support as part of an imaging system, the imaging device tile comprising a semiconductor detector with a plurality of pixel cells coupled to a semiconductor substrate with a corresponding plurality of pixel circuits, said semiconductor detector and said semiconductor substrate being carried on a mount having an imaging device tile contact, said imaging support including securing mechanism being configured for mounting each of said imaging device tiles on said imaging support in a non-destructive, removable manner at respective tile mounting locations, each tile mounting location including an imaging support contact at a contact position, each of said imaging support contacts being configured to cooperate with a respective imaging device tile contact, said imaging device tile contact and said imaging support contact enabling a signal of a type selected from a group consisting of a supply, a control signal and a readout signal to be transferred between said imaging device tile and said imaging support.

27. The imaging device tile of claim 26, wherein each tile mounting location further comprises a plurality of imaging support contacts configured to cooperate with a plurality of respective imaging device tile contacts.

28. The imaging device tile of claim 26, wherein the securing mechanism is configured for removably mounting the imaging device tile by maintaining a force on the imaging device tile to urge the imaging device tile towards said imaging support.

29. The imaging device tile of claim 26, wherein the securing mechanism is configured to apply an adjustable mounting force for removably mounting the imaging device tile on said imaging support.

30. The imaging device tile of claim 26, wherein said securing mechanism comprises a protrusion extending from said imaging device tile.

31. The imaging device tile of claim 26, wherein said securing mechanism comprises a threaded securing means.

32. The imaging device tile of claim 31, wherein said securing mechanism further comprises a screw.

33. The imaging device tile of claim 31, wherein said securing mechanism further comprises a threaded hole.

34. The imaging device tile of claim 26, wherein the imaging device comprises a plurality of imaging regions from which respectively identifiable output signals are produced.

35. The imaging device tile of claim 26, wherein said imaging device tile further comprises a pixel semiconductor imaging device.

36. A method of forming an imaging array, said method comprising the steps of:

providing an imaging support for supporting a plurality of imaging device tiles at respective tile mounting locations to define a tiled imaging surface, each of said imaging device tiles comprising a semiconductor detector with a plurality of pixel cells coupled to a semiconductor substrate with a corresponding plurality of pixel circuits, said semiconductor detector and said semiconductor substrate being carried on a mount having an imaging device tile contact, said imaging support being configured for mounting each of said imaging device tiles at respective tile mounting locations, each tile mounting location including an imaging support contact at a contact position, each of said imaging support contacts being configured to cooperate with a respective imaging device tile contact, said imaging device tile contact and said imaging support contact enabling a signal of a type selected from a group consisting of a supply, a control signal and a readout signal to be transferred between said imaging device tile and said imaging support; and removably mounting a plurality of imaging device tiles on said imaging support in a non-destructive, removable manner, to define said tiled imaging surface.

37. The method of claim 36, further comprising the steps of:

providing a plurality of imaging supports, each for supporting a plurality of imaging device tiles in respective positions to define a tiled imaging surface;

removably mounting said imaging device tiles on a first one of said imaging supports in a non-destructive, removable manner at a first time; and removing at least some of said imaging device tiles from said first support and removably mounting said imaging device tiles on a second one of said imaging supports in a non-destructive, removable manner at a second time.

38. The method of claim 36, further comprising the step of establishing electrical connections between the imaging device tile and the imaging support for at least a transfer of a supply, a control signal and a readout signal as the imaging device tile is received at its tile mounting location.

39. The method of claim 36, wherein the step of removably mounting the imaging device tiles comprises securing the imaging device tile by applying a force to be maintained on the imaging device tile to urge the tile towards the imaging support.

40. The method of claim 36, wherein the step of removably mounting said imaging device tiles comprises applying an adjustable degree of mounting force for accurately locating and securing said imaging devices on said support in a removable, non-destructive manner.

41. The method of claim 36, wherein said imaging devices comprise pixel semiconductor imaging devices.

42. An imaging system comprising a plurality of imaging device tiles mountable on an imaging support to define a tiled imaging surface, wherein at least one of the imaging device tiles comprises:

a semiconductor detector with a plurality of pixel cells;

a semiconductor substrate coupled to said semiconductor detector, said semiconductor substrate having a corresponding plurality of pixel circuits;

an imaging device tile contact configured to cooperate with a corresponding imaging support contact, said imaging device tile contact and said imaging support contact enabling a signal of a type selected from a group consisting of a supply, a control signal and a readout signal to be transferred between said imaging device tile and said imaging support;

a mount carrying said semiconductor detector and said semiconductor substrate; and a securing mechanism removably attaching said imaging device tile to said imaging support in a non-destructive, removable manner at respective tile mounting locations of said imaging support.

* * * * *